United States Patent
Wishman et al.

(10) Patent No.: US 9,781,859 B1
(45) Date of Patent: Oct. 3, 2017

(54) CABLE ROUTING FOR MOVABLE TRAYS

(71) Applicant: Amazon Technologies, Inc., Seattle, WA (US)

(72) Inventors: Max Jesse Wishman, Seattle, WA (US); Felipe Enrique Ortega Gutierrez, Tacoma, WA (US)

(73) Assignee: Amazon Technologies, Inc., Seattle, WA (US)

( * ) Notice: Subject to any disclaimer, the term of this patent is extended or adjusted under 35 U.S.C. 154(b) by 2 days.

(21) Appl. No.: 14/733,710

(22) Filed: Jun. 8, 2015

(51) Int. Cl.
*H05K 7/14* (2006.01)
*F16L 3/015* (2006.01)
*F16L 3/26* (2006.01)

(52) U.S. Cl.
CPC ............ *H05K 7/1491* (2013.01); *F16L 3/015* (2013.01); *F16L 3/26* (2013.01); *H05K 7/1492* (2013.01)

(58) Field of Classification Search
CPC ..... H05K 7/1491; H05K 7/1492; F16L 3/015; F16L 3/26
See application file for complete search history.

(56) References Cited

U.S. PATENT DOCUMENTS

| | | | | |
|---|---|---|---|---|
| 6,544,057 B1* | 4/2003 | Stremick | ............... | H01R 35/02 439/162 |
| 6,944,383 B1* | 9/2005 | Herzog | ............... | G02B 6/4455 174/50 |
| 8,376,103 B1* | 2/2013 | Sliger | ................... | H02G 11/02 191/12.2 R |
| 9,173,312 B1* | 10/2015 | Jau | ....................... | G11B 33/126 |
| 2004/0165357 A1* | 8/2004 | Schneeberger | ........ | H02B 1/052 361/724 |
| 2010/0172083 A1* | 7/2010 | Randall | ............... | G11B 33/126 361/679.31 |
| 2012/0069514 A1* | 3/2012 | Ross | .................. | H05K 7/20727 361/679.33 |
| 2012/0134099 A1* | 5/2012 | Zhang | ................... | G06F 1/184 361/679.37 |
| 2013/0003317 A1* | 1/2013 | Gong | .................. | H05K 7/1491 361/726 |
| 2013/0077219 A1* | 3/2013 | Fu | ....................... | H02G 11/006 361/679.02 |

\* cited by examiner

*Primary Examiner* — Adrian S Wilson
*Assistant Examiner* — Abhishek Rathod
(74) *Attorney, Agent, or Firm* — Kilpatrick Townsend & Stockton LLP

(57) ABSTRACT

Cable-routing systems can be provided for a tray configured for movement between an extended position and a stowed position. The cable-routing system can include a biasing mechanism and a pivot. The pivot can receive a bend of a cable about the pivot. The pivot can be coupled with the biasing mechanism. Movement of the tray toward the extended position can pull the cable away from a stored state against a biasing force of the biasing mechanism. The cable can be biased into the stored state by the biasing force of the biasing mechanism when the tray is in or moved toward the stowed position.

20 Claims, 4 Drawing Sheets

CABLE ROUTING FOR MOVABLE TRAYS

BACKGROUND

A datacenter is a facility used to house a collection of computer servers and associated components, typically network hardware. The collection of computer servers is often called a "server cluster" or "server farm," and is designed to accomplish server needs far beyond the capability of a single machine. The networking hardware typically includes network switches and/or routers which enable communication between the different parts of the server farm and the users of the server farm. Datacenters are commonly used for cluster computing, web services, remote data storage, web hosting, and other web services. Datacenters are increasingly being used by enterprises instead of, or in addition to, mainframe computers. As the demand for datacenters continues to increase, a need exists to limit the cost of operating a datacenter and/or to maintain availability of datacenter computing resources.

Datacenters utilize a variety of servers and networking hardware. Often, multiple servers and/or networking hardware components are arranged in racks. In some cases, an individual component in a rack may warrant individual attention without disrupting operations of the other components in the rack. As such, some racks for datacenters have components such as servers and/or networking hardware mounted for sliding in and out of the rack so that the components can be individually accessed or serviced. In some scenarios, it may be desirable to maintain wired connections (e.g., for data or power) to the component while the component is being inspected or otherwise serviced. Cables that are sized to accommodate connection of the component when the tray is extended from the rack may be longer than needed when the tray is returned into the rack. This may result in unwieldy amounts of cable that may become entangled or get in the way of other components of the rack. Additionally, operators handling cables to remedy or avoid such tangling or obstruction may also risk inadvertently pulling cables out of connection points and causing disruptions in datacenter operations, which may be costly or otherwise problematic.

BRIEF DESCRIPTION OF THE DRAWINGS

Various embodiments in accordance with the present disclosure will be described with reference to the drawings, in which.

DETAILED DESCRIPTION

In the following description, various embodiments will be described. For purposes of explanation, specific configurations and details are set forth in order to provide a thorough understanding of the embodiments. However, it will also be apparent to one skilled in the art that the embodiments may be practiced without the specific details. Furthermore, well-known features may be omitted or simplified in order not to obscure the embodiment being described.

Embodiments herein are directed to cable routing systems. A cable routing system can be used for storing cables that connect an appliance on a movable tray to a connection port that is mounted on a structure that is distinct from the tray. The tray can be connected, for example, to a rack, such as a server rack. For example, in embodiments, the cable routing system may be used to store a cable connecting a server on a sliding tray to a power socket of a power distribution unit that is mounted to a rack in which the tray slides. A cavity of the cable routing system can store the cable when the tray is in a stowed position. The cable can feed out of the cavity and/or into an extended state to reach the appliance when the tray is in the extended position. A retractor of the cable routing system can pull the cable into the cavity and/or into a stored state, e.g., automatically in response to the tray moving into or toward the stowed position. For example, a bend of the cable may be routed about a pivot of the retractor so as to be pulled into the cavity as a biasing mechanism of the retractor urges the pivot into the cavity. An extra length of the cable that is used to reach the appliance when the tray is in an extended position can thus be stored in an organized fashion by the retractor without requiring handling of the cable or other intervention by an operator of the tray.

Figure 1:
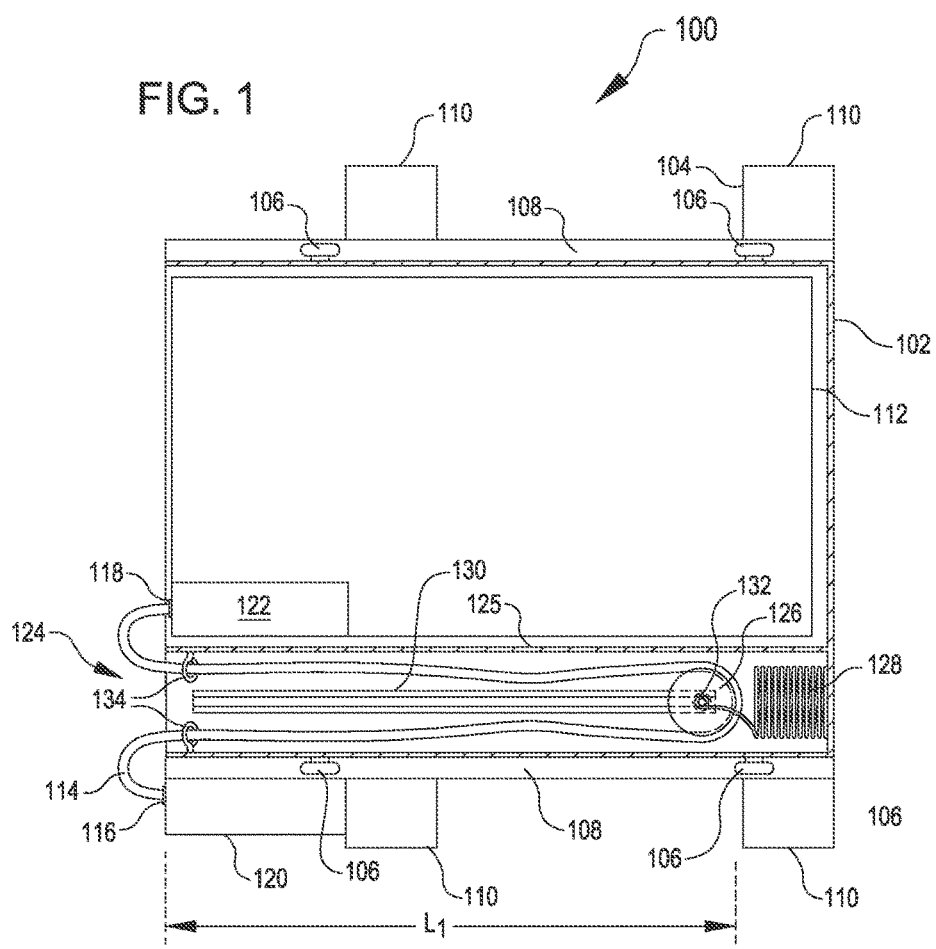
FIG. 1 is a top view of a cable routing system with a tray in a stowed position according to some embodiments.
Figure 2:
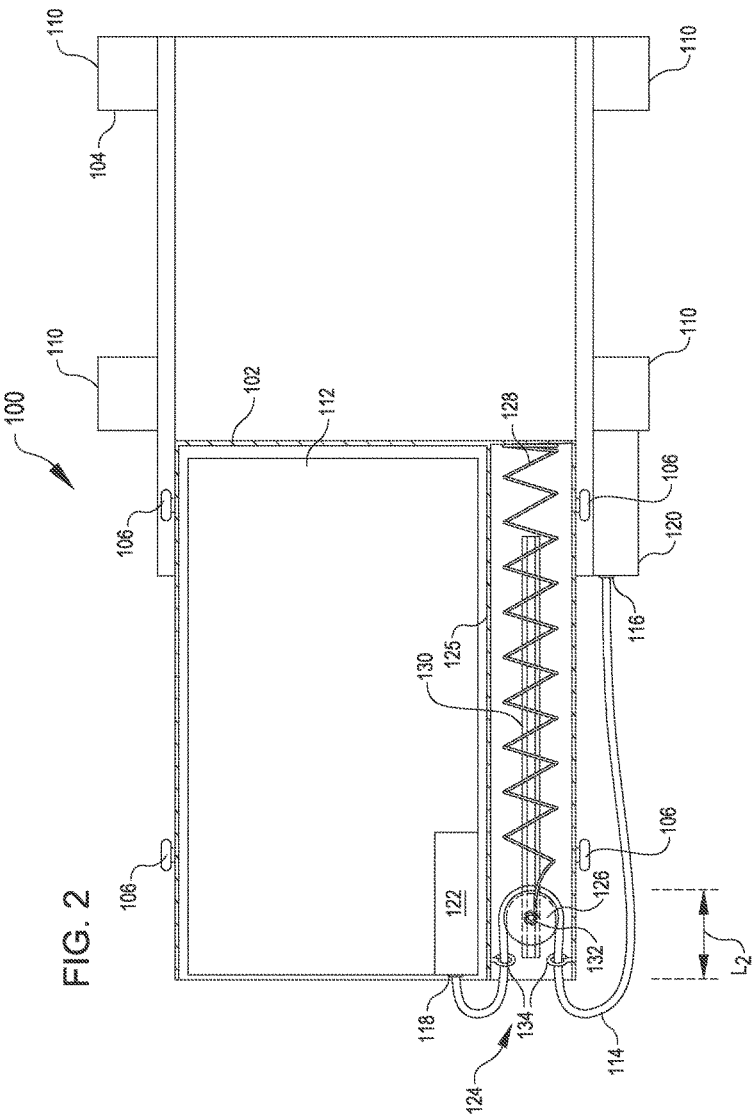
FIG. 2 is a top view of the cable routing system of FIG. 1 with the tray in an extended position according to some embodiments.

An example of a cable routing system 100 with a retractor is shown in FIGS. 1 and 2. The cable routing system 100 includes a tray 102 received in a rack 104. The tray 102 is movable relative to the rack 104 between a stowed position (e.g. FIG. 1) and an extended position (e.g. FIG. 2). For example, the tray 102 illustrated in FIG. 1 includes wheels 106 arranged to roll along rails 108 of the rack 104 to facilitate movement of the tray 102 between the extended and stowed positions. The rails 108 illustrated in FIGS. 1 and 2 are supported by a frame 110 of the rack 104, such as by vertical posts or other upright supports. Other arrangements for facilitating movement of the tray 102 relative to the rack 104 may also be utilized. For example, the arrangement of the rails 108 and wheels 106 may be reversed, such that the rails 108 are coupled with the tray 102 for movement along wheels 106 that are coupled to the rack 104. In some embodiments, the wheels 106 may be replaced by additional rails that couple with the rails 108 for sliding. For example, a telescoping rail system may be used to support and facilitate movement of the tray 102.

The tray 102 shown in FIGS. 1 and 2 includes an appliance 112. In some embodiments, the appliance corresponds to a server and/or network hardware components for a data center. Movement of the tray 102 relative to the rack 104 permits the appliance 112 to be moved to a position in front of the frame 110 of the rack 104, e.g., to provide greater access to the appliance 112 from a front (e.g. the left side of FIG. 1) of the rack 104, such as for servicing by a technician. In some embodiments, the tray 102 forms part of a body or casing of the appliance 112. As one example, the tray 102 may correspond to an outer casing of a server that is attached by a telescoping rail system to the rack 104.

The cable routing system 100 shown in FIGS. 1 and 2 includes a cable 114, such as for electrically connecting a first connection point 116 with a second connection point 118. The first connection point 116 corresponds to a structure 120 that does not move with the tray 102, and the second connection point 118 corresponds to an object 122 that does move with the tray. For example, in one embodiment, one end of the cable 114 connects into a power socket (first connection point 116) of a power distribution unit (structure 120) mounted on the frame 110 of the rack 104, and the opposite end of the cable 114 connects into a power port (second connection point 118) of a power supply unit (object 122) of a server (appliance 112) mounted on the tray 102. In some embodiments, the cable 114 may be replaced with and/or include a conduit for other connection types in addition to or in the alternative to electrical connection, such as connections for optical communication, acoustic communication, and/or fluid communication.

The cable 114 is retracted into an area or space either on the rack 104 or attached to the tray 102. In embodiments, the space is a cavity. For example, a cavity 124 of the cable routing system 100 stores the cable 114 when the tray 102 is in the stowed position (e.g., FIG. 1). The cavity 124 is shown in FIG. 1 as an elongate cavity extending along a side of the tray 102 and having a front facing the same direction as the front of the tray 102. Placement of the cavity along a side of the tray 102 may permit the back of the appliance 112 to be unobstructed for maintenance purposes and/or airflow purposes. In the embodiment shown in FIGS. 1 and 2, the cavity 124 is located on the tray 102; however, in alternate embodiments, the cavity 124 can be located separate from the tray 102. In some embodiments, the cavity 124 has a wall 125 or other structure separating the cavity 124 from another portion of the tray 102 (e.g., the rest of the tray 102 in FIG. 1). In other embodiments, the cavity 124 is a space defined between other features (e.g., between an edge of the appliance 112 and an edge of the tray 102). For example, the appliance 112 may be sized to be slightly smaller than a tray 102 for a rack 104 of a standardized size so as to provide room for the cavity 124 on the tray 102. In some embodiments, the cavity 124 may be positioned on a surface of the rack 104 with or without other adjacent features, for example, exposed to an outside of the rack 104 or located underneath a base of the rack 104.

In the embodiment shown in FIGS. 1 and 2, the cable routing system 100 includes a wheel or other rolling element 126 and a spring 128 coupled with the rolling element 126. For example, the spring 128 may be connected to an axle 132 of the rolling element 126. In the stowed position (e.g., FIG. 1), the rolling element 126 is positioned within the cavity 124. The spring 128 can bias or urge the rolling element 126 away from an entrance of the cavity 124 (e.g., away from the front end at the left in FIG. 1).

A bend of the cable 114 is routed around or about the rolling element 126. The cable 114 can slide or roll along the rolling element 126, such as in response to the tray 102 being moved relative to the rack 104. Movement of the tray 102 out of the rack 104 (e.g., from the position of FIG. 1 to the position of FIG. 2) can pull a portion of the cable 114 out of the cavity 124 and/or toward an extended state. For example, the cable 114 may have a length that increases between an entrance or open end of the cavity 124 and the distribution unit or other structure 120 as the tray 102 is moved from the stowed position of FIG. 1 to the extended position of FIG. 2. This in turn can reduce a length of cable 114 on either side of the rolling element 126 within the cavity 124 (e.g., reducing the length from $L_1$ in FIG. 1 to $L_2$ in FIG. 2). The change in length and movement of the cable 114 about the rolling element 126 can exert a force on the rolling element 126 and pull the rolling element 126 toward the entrance of the cavity 124.

The rolling element 126 can be pulled toward the entrance of the cavity 124 against a biasing force provided by the spring 128. The tension in the cable 114 and the biasing force from the spring 128 can keep the cable 114 taut as it is moved in and out of the cavity 124. This can automatically maintain the cable 114 in an organized and untangled state. When a tension force in the cable 114 is reduced or eliminated (such as by moving the tray 102 from the extended position of FIG. 2 toward the stowed position of FIG. 1), the biasing force from the spring 128 can pull the rolling element 126 away from the entrance of the cavity 124 to draw the cable 114 back into a stored state in the cavity 124.

In some embodiments, the rolling element 126 may be constrained to a specific path of movement by a track 130 or other guide. For example, in the embodiment shown in FIGS. 1 and 2, the axle 132 of the rolling element 126 extends into the track 130 to guide the rolling element 126 along the length of the cavity 124. Additionally or alternatively, the cavity 124 may include guides 134 for aligning the cable 114 as it enters and exits the cavity 124. Although the guides 134 are shown as eyebolts in FIG. 1, the guides 134 can be any suitable structure for aligning and/or guiding the cable 114, including structure such as plates with slots or grooves.

In some embodiments, the rolling element 126 is sized to reduce stress on the cable 114. For example, the rolling element may have a radius sized to have a certain ratio to the diameter of the cable 114. In some aspects, the rolling element is at least five times larger in radius than the diameter of the cable 114.

The rolling element 126 coupled with the spring 128 is one example of a suitable retractor for the cable routing system 100. However, embodiments are not limited to this arrangement. A retractor can include any suitable pivot in place of the rolling element 126 and/or any suitable biasing mechanism in place of the spring 128. The pivot can receive a cable so that the cable changes direction about the pivot, and the biasing mechanism can urge the pivot in a particular direction. Embodiments may include other types of pivots and/or biasing mechanisms, including, but not limited to other structures described elsewhere herein. For example, a retractor may additionally or alternatively include any elastic member or other member that exerts a biasing force, such as a member formed from a material that stretches and exhibits a "memory" to retract to the position from which it was stretched when the stretching force subsides.

Figure 3:
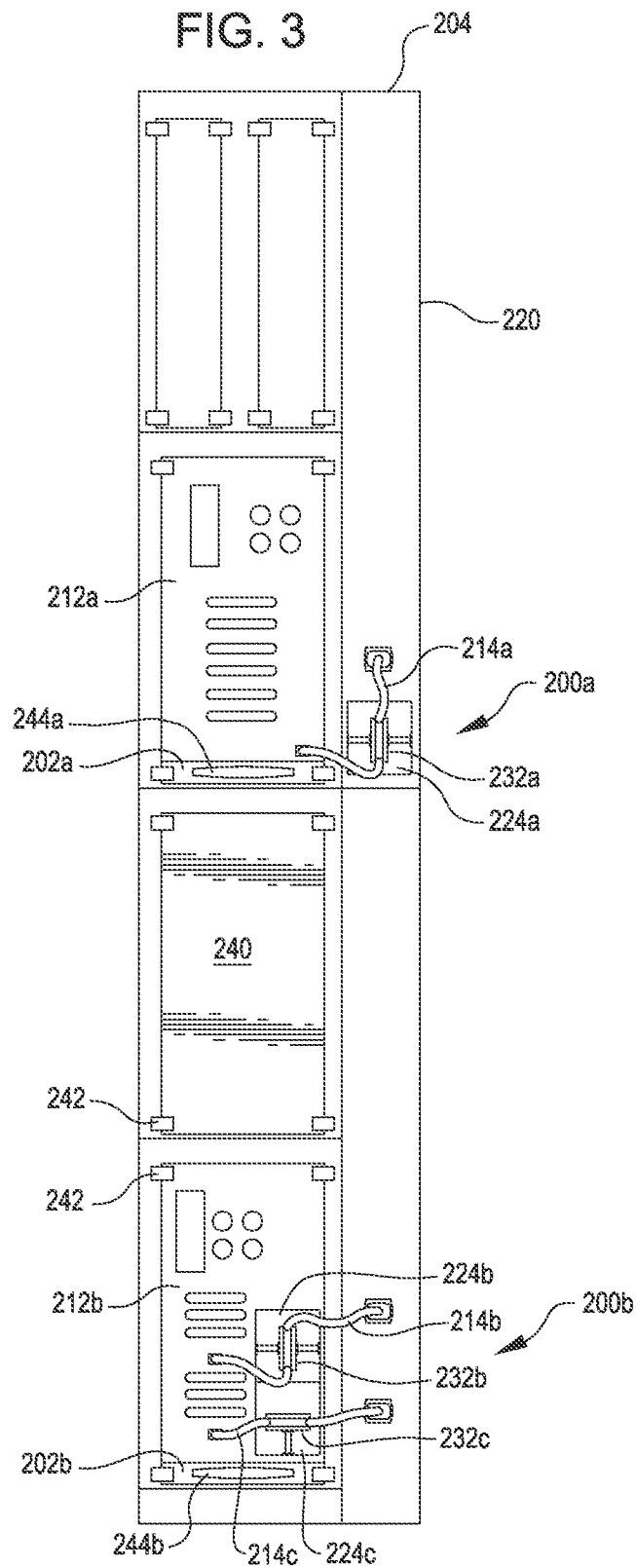
FIG. 3 is a front view of an example of a server rack with various cable routing systems according to some embodiments.

Various types of cable routing systems can be used with server racks. For example FIG. 3 is a front view of an example of a server rack 204 with various cable routing systems 200a, 200b (collectively cable routing systems 200). The cable routing systems 200 can be used for servers 212 or other components supported by trays 202 that are movable relative to the server rack 204. The trays 202 can include handles 244 for ease of pulling out the trays 202.

Although the cable routing system 100 shown in FIGS. 1 and 2 includes a tray 102 having a cavity 124 positioned on the tray or as part of the tray 102, in some embodiments a cavity may be part of or mounted on a rack instead. For example, in FIG. 3, the cable routing system 200a includes a cavity 224a mounted in the server rack 204 rather than on a tray 202a. In contrast, the cavities 224b and 224c for the cable routing system 200b are associated with the tray 202b rather than the server rack 204.

Cables 214 can be routed into and/or out of cavities 224 in any respective orientation. For example, the cable 214a is routed vertically into the cavity 224a and horizontally out of the cavity 224a. In contrast, cable 214b is routed horizontally in and out respectively at a top and bottom of the cavity 224b. According to differing embodiments, cables 214 can be routed over vertically oriented pivots (such as rolling elements 232a and 232b), horizontally oriented pivots (such as rolling element 232c), and/or pivots oriented in other directions.

Some cable routing systems 200 can include multiple cavities 224 for routing cables 214. For example, the cable routing system 200b includes the cavities 224b and 224c, such as to route separate cables 214b and 214c, e.g. such as for data and power transmission or any other connection warranted by a server or other appliance on a tray 202. To this end, the cables 214 can use any appropriate connection type as well. The server rack 204 can include power distribution units 220, such as to provide power and/or data connections to a server 212. In the embodiment shown in FIG. 3, one power distribution unit 220a is adapted to include space to permit the placement of and/or access to a cavity 224a.

The server rack 204 shown in FIG. 3 includes panels 240 for selectively covering openings of the server rack 204. These plates or panels 240 are removed to install a server 212 and/or a tray 202. When a server 212 and/or tray 202 is completely removed from the server rack 204, for example for repair, the panel 240 can be mounted back over the opening, such as to prevent the flow of cold and hot air between a cold zone and a hot zone on opposite sides of the server rack 204. The panels can be held in place by clips 242. The clips 242 may engage the trays 202 and/or the servers 212 to hold the components in position. In some embodiments, the clips 242 can be released to allow movement of the trays 202 between extended and stowed positions and then re-engaged to hold the trays 202 in position.

Figure 4:
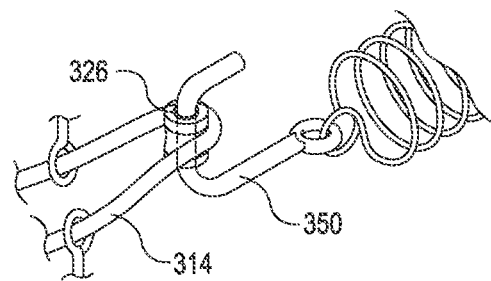
FIG. 4 illustrates a hook that can be used in cable routing systems in some embodiments.

Other forms of retractors can also be used in cable routing systems. For example, FIG. 4 illustrates a hook 350 that can be used in a cable routing system 300. The hook 350 serves as a pivot for cable 314. In some aspects, the hook 350 includes a rolling element 326 to reduce an amount of friction during movement of the cable 314. In some aspects, the rolling element 326 may be omitted or of a different shape. For example, in some aspects the hook 350 includes a low friction or slippery material that permits the cable 314 to move or pivot about the hook 350.

Figure 5:
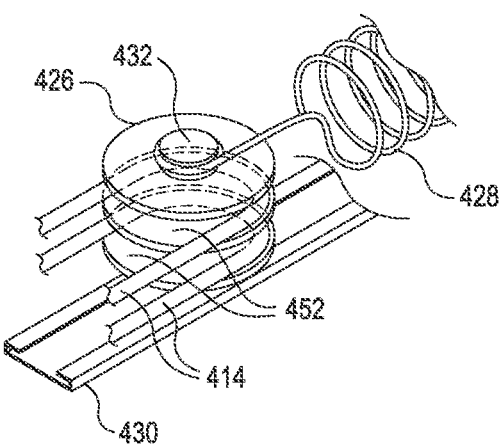
FIG. 5 illustrates a rolling element for routing multiple cables according to some embodiments.

In some embodiments, multiple cables can be routed in a single cavity. For example, FIG. 5 illustrates a wheel or rolling element 426 for routing multiple cables 414. The rolling element 426 includes grooves 452 in which cables 414 are each individually routed. Although the wheel is shown with two grooves 452, more than two grooves 452 may also be provided. The rolling element 426 may have an axle 432 that anchors the rolling element 426 to a track 430 in a similar fashion described with respect to features sharing similar names in the description of FIG. 1 above. Although the rolling element 426 is shown in a horizontal configuration in FIG. 5, the rolling element 426 alternatively could be used in a vertical orientation instead.

Figure 6:
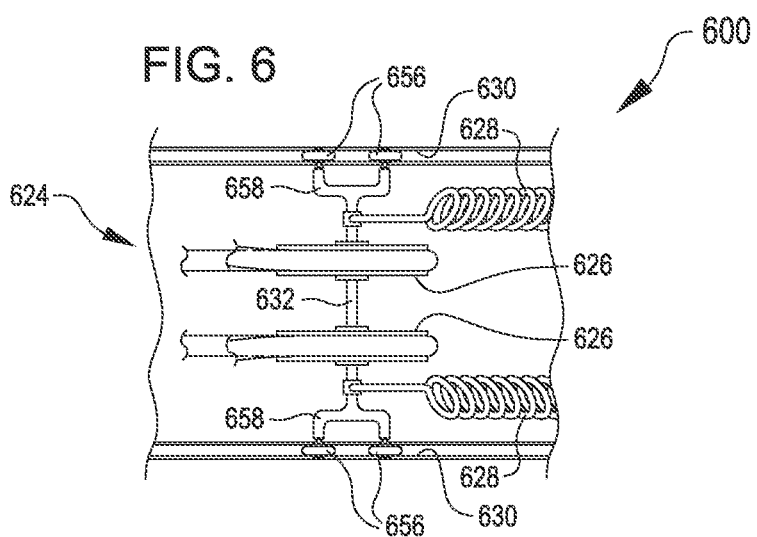
FIG. 6 illustrates an assembly with multiple rolling elements for routing multiple cables according to some embodiments.

In some aspects, cable routing systems can include multiple pivots and/or multiple biasing members in a single cavity. For example, FIG. 6 illustrates a cable routing system 600 having multiple rolling elements 626 and multiple biasing members 628. Additionally FIG. 6 illustrates an alternative to the track 130 of FIG. 1. FIG. 6 illustrates tracks 630 on either side of the cavity 624 with additional rolling elements 656 received in the tracks 630. The multiple rolling elements 626 may share a single axle 632 (or have separate axles). The single axle 632 when used may include forks 658 to further secure the axle 632 within the cavity 624 and prevent the axle 632 or associated rolling elements 626 from rotating out of alignment with the cavity 624.

Although some description above primarily describes cable routing systems in the context of servers and server racks, embodiments herein may be applicable to any other form of structure having a tray for receiving an appliance and movable relative to a rack. Additionally, in some instances less than all of the described elements will be included in a separate unit. For example, in some aspects, a tray having a cavity with a retractor may be provided as a separate unit so as to replace an existing tray, leaving an end user to supply the cable and/or appliance.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate embodiments of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Preferred embodiments of this disclosure are described herein, including the best mode known to the inventors for carrying out the disclosure. Variations of those preferred embodiments may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

All references, including publications, patent applications, and patents, cited herein are hereby incorporated by reference to the same extent as if each reference were individually and specifically indicated to be incorporated by reference and were set forth in its entirety herein.

What is claimed is:

1. A rack comprising:
a power distribution unit located at a front of the rack;
an appliance comprising at least one of a server or a network hardware component, the appliance having a power supply unit located at a front of the appliance, the front of the appliance and the front of the rack facing the same direction;
a tray slidable into and out of the front of the rack between an extended position and a stowed position, the tray carrying or forming part of the appliance such that (a) the appliance is accessible from outside the front of the rack for servicing when the tray is in the extended position, and (b) the appliance is positioned at least partially within the rack in the stowed position;
a cable connecting the power supply unit of the appliance with the power distribution unit, the cable having a length sufficient for reaching between the power supply unit of the appliance and the power distribution unit when the tray is in the extended position;
an elongated cavity extending along a lateral side of the tray and having a front facing the same direction as the front of the appliance and the front of the rack; and
a retractor configured to pull the cable in through the front of the cavity in response to the tray sliding towards the stowed position, wherein in each of the extended position and the stowed position, the retractor is located at least partially in the elongated cavity extending along the lateral side of the tray.

2. The rack of claim 1, wherein the retractor comprises:
a biasing mechanism positioned within the cavity; and
a pivot positioned within the cavity, the pivot receiving a bend of the cable about the pivot, the pivot coupled with the biasing mechanism so that (a) movement of the tray toward the extended position pulls the cable at least partially out of the cavity against a biasing force of the biasing mechanism, and (b) the cable is biased into the cavity by the biasing force of the biasing mechanism when the tray is in or moved toward the stowed position.

3. The rack of claim 2, further comprising a track positioned in the cavity and configured to guide movement of the pivot along the cavity.

4. The rack of claim 2, wherein the pivot comprises a rolling element.

5. The rack of claim 4, wherein the rolling element has a radius at least 5 times the size of the diameter of the cable.

6. The rack of claim 2, wherein the pivot comprises a hook.

7. A rack for an appliance having a cable, the rack comprising:
a frame configured to receive an assembly with a first connection port;
a tray coupled with the frame for movement along a sliding direction between an extended position and a stowed position, the tray comprising a front and a rear separated from one another along the sliding direction, the tray further comprising lateral sides separated from one another along a lateral direction transverse to the sliding direction, the tray configured to receive or form part of the appliance so that the cable connects the first connection port with a second connection port of the appliance; and
a retractor connectable with the cable and including a biasing mechanism configured to pull the cable taut while the cable retracts and extends in response to the tray moving between the stowed position and the extended position, wherein in each of the extended position and the stowed position, the retractor is located at least partially in a cavity extending along and positioned offset in the lateral direction from one of the lateral sides of the tray, and wherein the retractor contacts a different portion of the cable in the stowed position than in the extended position of the tray.

8. The rack of claim 7, wherein the wherein the retractor comprises:
the biasing mechanism; and
a pivot configured to receive a bend of the cable about the pivot, the pivot coupled with the biasing mechanism so that, when the bend of the cable is received about the pivot, (a) movement of the tray toward the extended position pulls the cable at least partially away from a stored state against a biasing force of the biasing mechanism, and (b) the cable is biased toward the stored state by the biasing force of the biasing mechanism when the tray is in or moved toward the stowed position.

9. The rack of claim 8, wherein the pivot comprises a rolling element with multiple channels for each receiving a different cable.

10. The rack of claim 8, wherein the retractor comprises one or more springs.

11. The rack of claim 7, wherein the cable for connecting the first connection port with the second connection port comprises at least one of a power cable or a data cable.

12. The rack of claim 7, wherein the cable in a stored state is located at least partially in the cavity, wherein the cavity is located on the frame.

13. The rack of claim 7, wherein the cable in a stored state is located at least partially in the cavity, wherein the cavity is located to the side of the tray.

14. A cable-routing system for a tray configured for movement along a sliding direction between an extended position and a stowed position, the tray comprising a front and a rear separated from one another along the sliding direction, the tray further comprising lateral sides separated from one another along a lateral direction transverse to the sliding direction, the cable-routing system comprising:
a biasing mechanism; and
a pivot configured to receive a bend of a cable about the pivot, the pivot coupled with the biasing mechanism so that, when the bend of the cable is received about the pivot, (a) movement of the tray toward the extended position pulls the cable toward an extended state against a biasing force of the biasing mechanism, and (b) the cable is biased toward a stored state by the biasing force of the biasing mechanism when the tray is in or moved toward the stowed position, wherein in each of the extended position and the stowed position, the pivot is located at least partially in a cavity extending along and positioned offset in the lateral direction from one of the lateral sides of the tray, and wherein the pivot contacts a different portion of the cable in the stowed state than in the extended state of the cable.

15. The cable-routing system of claim 14, wherein the cable in the stored state is located at least partially in the cavity, wherein the cavity is located on the tray.

16. The cable-routing system of claim 14, wherein the cable in the stored state is located at least partially in the cavity, wherein the cavity is located apart from the tray.

17. The cable-routing system of claim 14, wherein the pivot comprises a vertically-oriented rolling element.

18. The cable-routing system of claim 14, wherein the pivot comprises a horizontally-oriented rolling element.

19. The cable-routing system of claim 14, further comprising:
- a first cavity comprising the cavity and configured to receive the cable in the stored state;
- a second cavity;
- a second biasing mechanism positioned within the second cavity; and
- a second pivot positioned within the second cavity and configured to receive a bend of a second cable about the second pivot, the second pivot coupled with the second biasing mechanism so that, when the bend of the second cable is received about the second pivot, (a) movement of the tray toward the extended position pulls the second cable at least partially out of the second cavity against a biasing force of the second biasing mechanism, and (b) the second cable is biased into the second cavity by the biasing force of the second biasing mechanism when the tray is in or moved toward the stowed position.

20. The cable-routing system of claim 14, further comprising:
- a second pivot configured to receive a bend of a second cable about the second pivot, the second pivot coupled with the biasing mechanism or with a second biasing mechanism so that, when the bend of the second cable is received about the second pivot, (a) movement of the tray toward the extended position pulls the second cable at least partially toward an extended state against a biasing force of the biasing mechanism or the second biasing mechanism, and (b) the second cable is biased toward a stored state by the biasing force of the biasing mechanism or the second biasing mechanism when the tray is in or moved toward the stowed position.

* * * * *